(12) United States Patent
Takahagi et al.

(10) Patent No.: US 10,396,008 B2
(45) Date of Patent: Aug. 27, 2019

(54) SEMICONDUCTOR DEVICE

(71) Applicant: TOYOTA JIDOSHA KABUSHIKI KAISHA, Toyota-shi, Aichi (JP)

(72) Inventors: Satoshi Takahagi, Nagakute (JP); Takuya Kadoguchi, Toyota (JP); Yuji Hanaki, Nagoya (JP); Syou Funano, Toyota (JP); Shingo Iwasaki, Toyota (JP); Takanori Kawashima, Anjyou (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 70 days.

(21) Appl. No.: 15/855,210

(22) Filed: Dec. 27, 2017

(65) Prior Publication Data

US 2018/0218960 A1    Aug. 2, 2018

(30) Foreign Application Priority Data

Jan. 27, 2017    (JP) .................................. 2017-013673

(51) Int. Cl.
*H01L 23/051* (2006.01)
*H01L 23/367* (2006.01)
(Continued)

(52) U.S. Cl.
CPC ........ *H01L 23/367* (2013.01); *H01L 23/4334* (2013.01); *H01L 23/49524* (2013.01); *H01L 23/49562* (2013.01); *H01L 23/49568* (2013.01); *H01L 23/49575* (2013.01); *H01L 24/26* (2013.01); *H01L 25/072* (2013.01); *H01L 23/051* (2013.01); *H01L 23/3107* (2013.01); *H01L 2224/40245* (2013.01)

(58) Field of Classification Search
None
See application file for complete search history.

(56) References Cited

U.S. PATENT DOCUMENTS 9,006,784 B2 * 4/2015 Okumura ............ H01L 23/3672
257/177
9,762,140 B2 * 9/2017 Fukuoka ............. H01L 29/7395
(Continued)

FOREIGN PATENT DOCUMENTS

JP    2012-235081 A    11/2012
JP    2015-170810 A    9/2015

*Primary Examiner* — Nishath Yasmeen
(74) *Attorney, Agent, or Firm* — Oliff PLC

(57) ABSTRACT

A semiconductor device includes a first metal plate and a second metal plate which interpose a first semiconductor element therebetween, the first metal plate and the second metal plate being bonded to the first semiconductor element with first soldered portions; and includes a third metal plate and a fourth metal plate which interpose a second semiconductor element therebetween, the third metal plate and the fourth metal plate being bonded to the second semiconductor element with second soldered portions. A first joint provided at an edge of the first metal plate and a second joint provided at an edge of the fourth metal plate are bonded with a third soldered portion. A total sum of thicknesses of the first soldered portions is different from a thickness of the third soldered portion, a solidifying point of the thinner one is higher than a solidifying point of the thicker one.

2 Claims, 8 Drawing Sheets

(51) Int. Cl.
*H01L 23/433* (2006.01)
*H01L 23/495* (2006.01)
*H01L 23/00* (2006.01)
*H01L 25/07* (2006.01)
*H01L 23/31* (2006.01)

(56) References Cited

U.S. PATENT DOCUMENTS

| | | |
|---|---|---|
| 9,960,096 B2 * | 5/2018 | Okumura ................ H01L 25/07 |
| 10,103,091 B2 * | 10/2018 | Takahagi .......... H01L 23/49582 |
| 2014/0035112 A1 | 2/2014 | Kadoguchi et al. |
| 2016/0336251 A1 * | 11/2016 | Fukuoka ............. H01L 29/7395 |
| 2017/0018484 A1 | 1/2017 | Kadoguchi et al. |
| 2017/0278774 A1 * | 9/2017 | Hayashi ............. H01L 21/4825 |

* cited by examiner

SEMICONDUCTOR DEVICE

TECHNICAL FIELD

The technique disclosed herein relates to a semiconductor device. Especially, it relates to a semiconductor device in which two semiconductor elements are embedded, and that has metal plates electrically connected to electrodes of each semiconductor element exposed at surface(s) of the semiconductor device.

BACKGROUND

A semiconductor device in which two semiconductor elements are embedded, and that has metal plates electrically connected to electrodes of each semiconductor element exposed at surfaces of the semiconductor device is known. For example, each of Japanese Patent Application Publications No. 2015-170810 and No. 2012-235081 describes such a semiconductor device. Each of semiconductor elements includes electrodes on both surfaces thereof. Each of the semiconductor elements is interposed between a pair of metal plates, and the metal plates in the pair are respectively bonded to the corresponding electrodes with soldered portions. It should be noted that "an electrode and a metal plate are bonded with a soldered portion" herein includes a case where the electrode and a spacer are bonded with a soldered portion, and the metal plate is bonded to that spacer with another soldered portion on an opposite side with respect to the spacer. The two semiconductor elements are embedded in a resin package. Each pair of the metal plates has a surface of one of the metal plates exposed from the resin package, and this surface serves as a heat diffusing plate. For the sake of simplifying the explanation, the two semiconductor elements will be termed a first semiconductor element and a second semiconductor element, respectively. The pair of metal plates interposing the first semiconductor element therebetween will be termed first and second metal plates, and the pair of metal plates interposing the second semiconductor element therebetween will be termed third and fourth metal plates. The first and third metal plates are exposed at one surface of the resin package, and the second and fourth metal plates are exposed at an opposite surface to the one surface of the resin package. To electrically connect the two semiconductor elements, a first joint is provided at an edge of the first metal plate, a second joint is provided at an edge of the fourth metal plate which is exposed from the resin package on the opposite side to where the first metal plate is exposed, and these joints are bonded with a soldered portion inside the resin package.

SUMMARY

In the aforementioned semiconductor device, soldered portions are interposed between the first and second metal plates, and soldered portions are interposed between the third and fourth metal plates as well. The joints are provided at the respective edges of the first and fourth metal plates which are exposed at the respective surfaces of the resin package, and these joints are bonded with a soldered portion. The soldered portions contract upon solidifying. In bonding the metal plates and the semiconductor elements, the soldered portions contract between the first and second metal plates, and the soldered portions between the third and fourth metal plates also contract. The soldered portion between the joints provided at the edges of the first and fourth metal plates also contracts. When a total sum of thicknesses of the soldered portions between each pair of the metal plates and a thickness of the soldered portion between the joints differ, contracting amounts thereof become different, and thus, the metal plates provided with the joints may be tilted. In recent years, size reduction in semiconductor elements is in progress, and electrode areas are also becoming smaller. Due to this, a difference between a bonding area of an electrode and a metal plate and a bonding area of joints is becoming smaller, and thus tilt of the metal plates caused by the difference in the thicknesses of the soldered portions tends to become more prominent. A technique for suppressing tilt of metal plates caused by contraction of soldered portions is being desired.

A semiconductor device disclosed herewith may comprise a first semiconductor element, a second semiconductor element and first to fourth metal plate. Each of the first semiconductor element and the second semiconductor element may comprise electrodes on both surfaces thereof. A first metal plate and a second metal plate may interpose the first semiconductor element therebetween, the first metal plate and the second metal plate respectively being bonded to the electrodes of the first semiconductor element with respective soldered portions. A third metal plate and a fourth metal plate may interpose the second semiconductor element therebetween, the third metal plate and the fourth metal plate respectively being bonded to the electrodes of the second semiconductor element with respective soldered portions. The first semiconductor element and the second semiconductor element are embedded in a resin package. The first metal plate and the third metal plate are exposed at one surface of the resin package, and the second metal plate and the fourth metal plate are exposed at an opposite surface to the one surface of the resin package. A first joint may be provided at an edge of the first metal plate, a second joint may be provided at an edge of the fourth metal plate. The first joint may overlap with the second joint as seen along a direction in which the first metal plate and the first semiconductor element are stacked. The first joint and the second joint may be bonded with a soldered portion inside of the resin package. For convenience of explanation, the soldered portions between the first metal plate and the second metal plate will be termed "first soldered portions", the soldered portions between the third metal plate and the fourth metal plate will be termed "second soldered portions", the soldered portion between the first joint and the second joint will be termed "third soldered portion". A total sum of thicknesses of the first soldered portions between the first metal plate and the second metal plate may be different from a thickness of the third soldered portion between the first joint and the second joint, a solidifying point of a thinner one of the first soldered portions and the third soldered portion may be higher than a solidifying point of a thicker one of the first soldered portions and the third soldered portion. A total sum of thicknesses of the second soldered portions between the third metal plate and the fourth metal plate may be different from the thickness of the third soldered portion between the first joint and the second joint, a solidifying point of a thinner one of the second soldered portions and the third soldered portion may be higher than a solidifying point of a thicker one of the second soldered portions and the third soldered portion.

From the aforementioned relationship between the thicknesses of the soldered portions and the solidifying points thereof, when cooling is carried out after all the soldered portions have been heated, the soldered portion(s) being the thinner one (soldered portion(s) with the higher solidifying point) solidify before the soldered portion(s) being the thicker one (soldered portion(s) with the lower solidifying point). If the total sum of the thicknesses of the first soldered portions (or the second soldered portions) is smaller than the thickness of the third soldered portion, the soldered portions (the first or second soldered portions) between the metal plates opposed to each other solidify before solidification of the soldered portion (the third soldered portion) between the joints. The soldered portions between the metal plates opposed to each other solidify before the soldered portion between the joints solidifies, that is, before the joints are constrained by being bonded, and thus the metal plates opposed to each other will be bonded while maintaining their parallelism. On the other hand, if the thickness of the third soldered portion is smaller than the total sum of the thicknesses of the first soldered portions (or the second soldered portions), the soldered portion (the third soldered portion) between the joints solidifies before the soldered portions (the first or second soldered portions) between the metal plates opposed to each other. At this occasion, since the soldered portion (the third soldered portion) between the joints has a small thickness, and as such, its contraction amount is also small, and an influence imposed on tilt of the metal plates provided with the joints can be suppressed.

If the soldered portion(s) being the thicker one contract and solidify first, a large contraction amount thereof causes the thickness(es) of the soldered portion(s) being the thinner one to become even thinner, and thus, the thinner one may not secure a sufficient solder thickness. Moreover, if the solder thickness may become zero, interference may occur between the metal plates and the semiconductor elements or between the joints. An occurrence of insufficient thickness of soldered portion(s) after solidification can be avoided by allowing the soldered portion(s) being the thinner one to contract and solidify before the soldered portion(s) being the thicker one.

In the semiconductor device disclosed herein, the total sum of the thicknesses of the first soldered portions is preferably thinner than the thickness of the third soldered portion, and the total sum of the thicknesses of the second soldered portions is preferably thinner than the thickness of the third soldered portion. Considering the aforementioned relationship between the solidifying points, the solidifying point of the third soldered portion would be lower than the solidifying point of the first soldered portions and the second soldered portions. That is, the soldered portions (the first soldered portions) between the first and second metal plates opposed to each other and the soldered portions (the second soldered portions) between the third and fourth metal plates opposed to each other solidify before the soldered portion (the third soldered portion) between the joints. The metal plates opposed to each other are bonded while maintaining their parallelism with the solidification of the soldered portions between the metal plates opposed to each other taking place before the solidification of the soldered portion (the third soldered portion) between the joints provided at the edges of the metal plates, that is, before the joints are constrained.

The details and further improvements of the technique disclosed herein will be described in below embodiments.

EMBODIMENTS

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor devises.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Figure 1:
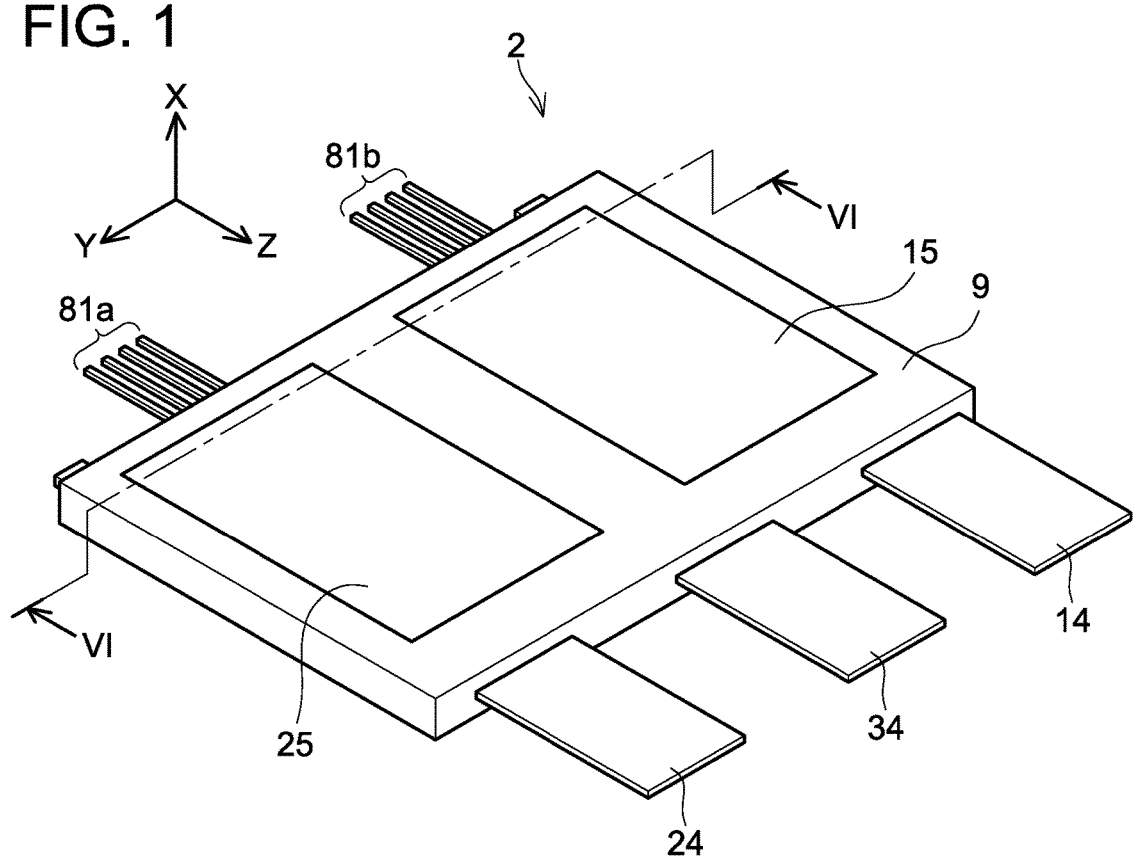
FIG. 1 is a perspective view of a semiconductor device.
Figure 2:
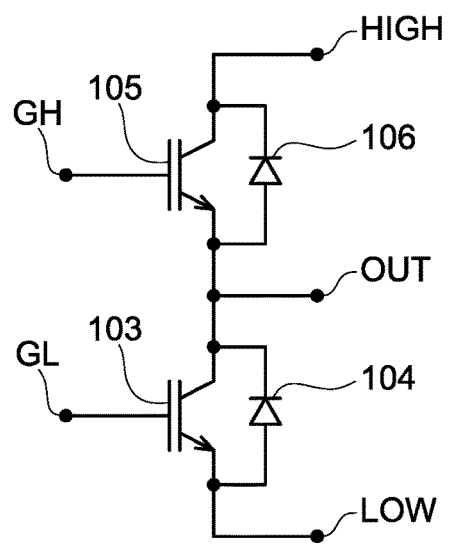
FIG. 2 is an equivalent circuit diagram of the semiconductor device.

A semiconductor device 2 of an embodiment will be described with reference to the drawings. FIG. 1 shows a perspective view of the semiconductor device 2. The semiconductor device 2 is a device in which four semiconductor elements are embedded in a package constituted of resin (resin package 9). An equivalent circuit diagram of the semiconductor device 2 is shown in FIG. 2. The semiconductor device 2 includes a circuit constituted of two transistors 103, 105 and two diodes 104, 106. The two transistors 103, 105 and the two diodes 104, 106 are all power semiconductor elements used for power conversion. Specifically, each of the transistors 103, 105 and the diodes 104, 106 has a current capacity of 100 amperes or more, and is an element used primarily for power conversion. The semiconductor device 2 is typically used in an inverter for generating alternating-current power to be supplied to a drive motor in an electric vehicle, a hybrid vehicle, or a fuel cell vehicle.

The two transistors 103, 105 are connected in serial. The diode 104 is connected to the transistor 103 in inverse parallel, and the diode 106 is connected to the transistor 105 in inverse parallel. For the sake of easier explanation, out of terminals on both ends of the serial connection, a terminal connected to a high potential side will be termed a HIGH terminal, and a terminal connected to a low potential side will be termed a LOW terminal. Further, an intermediate point in the serial connection will be termed an OUT terminal. A P terminal 24 in FIG. 1 corresponds to the HIGH terminal, an N terminal 34 in FIG. 1 corresponds to the LOW terminal, and an O terminal 14 in FIG. 1 corresponds to the OUT terminal. Further, a gate terminal GH of the transistor 105 corresponds to one of control terminals 81a in FIG. 1. A gate terminal GL of the transistor 103 corresponds to one of control terminals 81b in FIG. 1. Rest of terminals of the control terminals 81a, 81b are signal terminals for monitoring states of the semiconductor elements, or the like.

As shown in FIG. 1, heat diffusing plates 15, 25 are exposed at one surface of the resin package 9. The heat diffusing plate 15 has its one surface exposed at the one surface of the resin package 9, and has its other surface bonded, inside the resin package 9, to a first transistor element 3 and a first diode element 4 to be described later. The heat diffusing plate 25 has its one surface exposed at the one surface of the resin package 9, and has its other surface bonded, inside the resin package 9, to a second transistor element 5 and a second diode element 6 to be described later. Although cannot be seen in FIG. 1, two heat diffusing plates 12, 22 are exposed at the other surface of the resin package 9. The heat diffusing plates 12, 15, 22, 25 are constituted of metal, and more specifically, are constituted of copper. Hereinbelow, when the four heat diffusing plates need to be distinguished from one another, they may respectively be termed the first heat diffusing plate 12, the second heat diffusing plate 15, a third heat diffusing plate 22, and a fourth heat diffusing plate 25.

Figure 3:
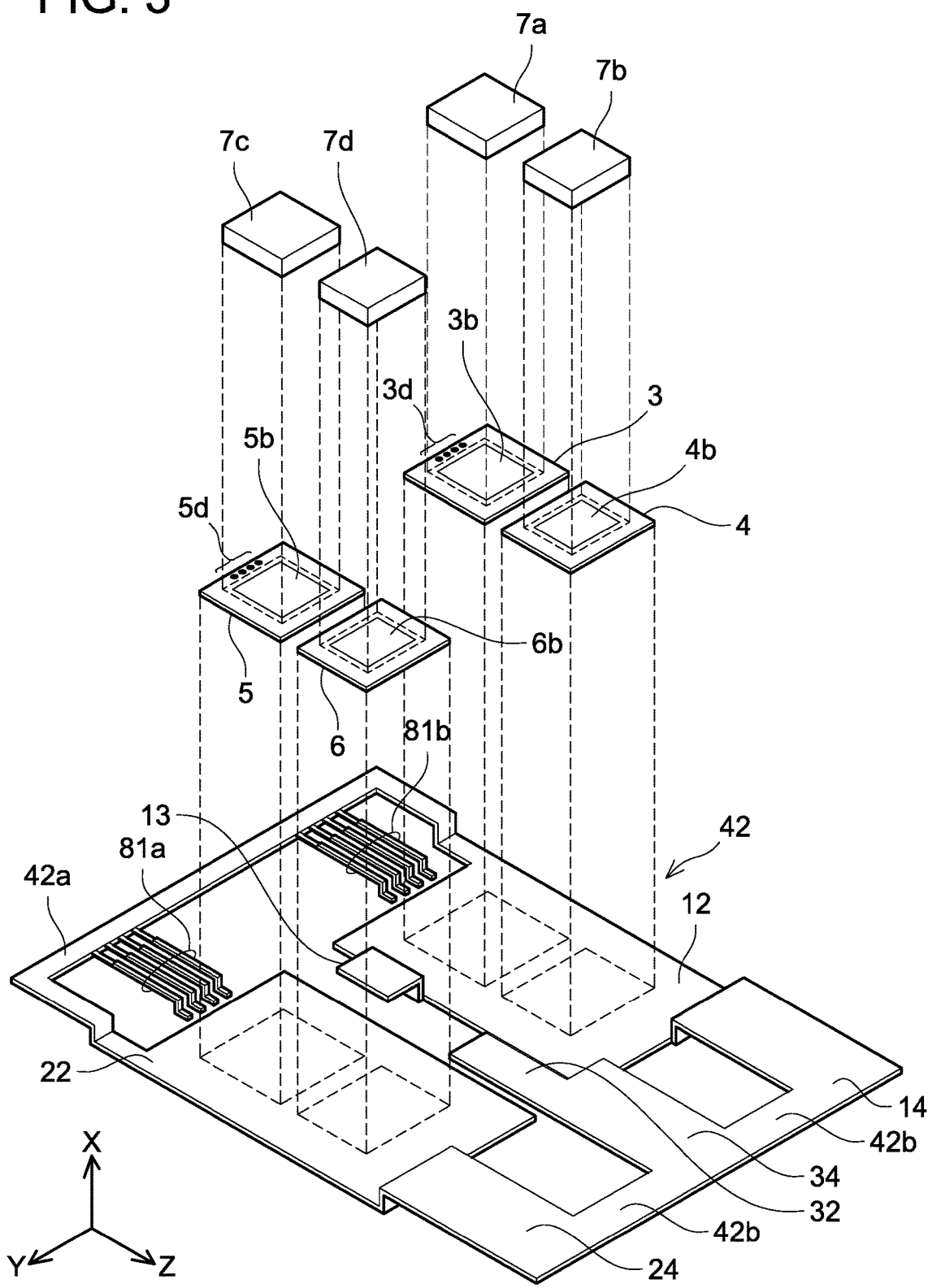
FIG. 3 is a disassembled diagram (1) of the semiconductor device.
Figure 4:
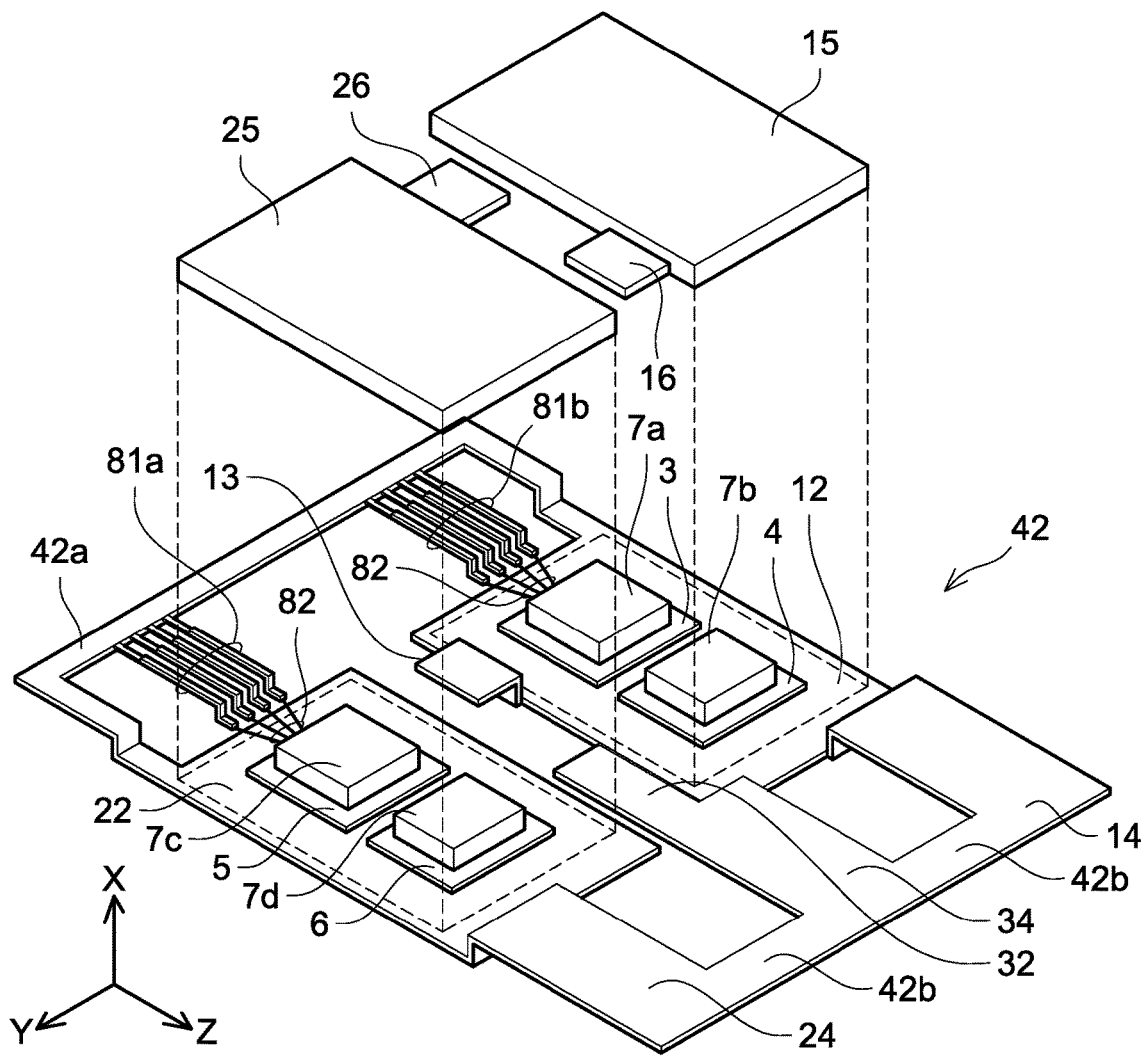
FIG. 4 is a disassembled diagram (2) of the semiconductor device.
Figure 5:
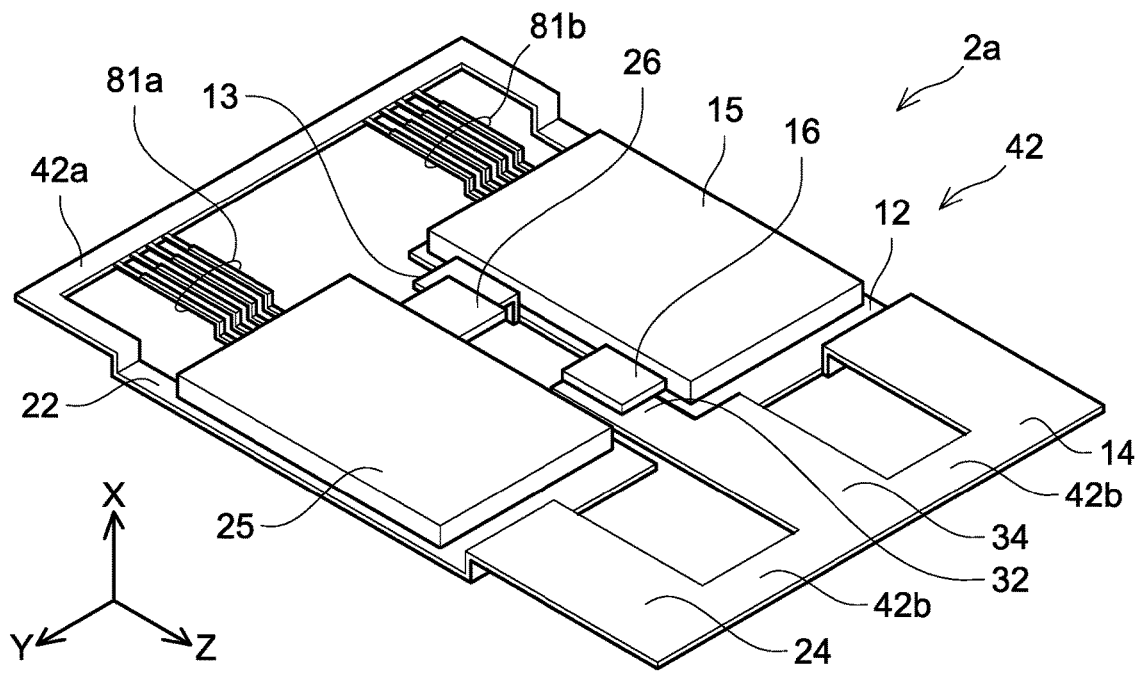
FIG. 5 is a perspective view of an assembly of semiconductor elements and heat diffusing plates.

FIG. 3 is a disassembled view of the semiconductor device 2 omitting the resin package 9 and the heat diffusing plates 15, 25. FIG. 4 is a perspective view in which the heat diffusing plates 15, 25 are detached. FIG. 5 is a perspective view of the semiconductor device 2 omitting the resin package 9 (that is, an assembly 2a of the heat diffusing plates and the semiconductor elements). In FIGS. 3 to 5, the N terminal 34, the P terminal 24, the O terminal 14, and the control terminals 81a, 81b are coupled by runners 42a, 42b, and they constitutes one component (lead frame 42). The semiconductor device 2 of FIG. 1 is completed when the runners 42a, 42b are cut off after the resin package 9 has been formed on the assembly 2a of FIG. 5. For the sake of simpler explanation, a positive direction along an X axis of a coordinate system in the drawings will be termed "upward", and a negative direction along the X axis will be termed "downward". In other drawings as well, these expressions regarding "upward" and "downward" may be used.

The two heat diffusing plates (the first heat diffusing plate 12 and the third heat diffusing plate 22) are located at a lowermost side. The O terminal 14 extends from one edge of the first heat diffusing plate 12, and a first joint 13 extends from (is provided at) another edge thereof. The P terminal 24 extends from one edge of the third heat diffusing plate 22. The N terminal 34 is arranged between the O terminal 14 and the P terminal 24. A joint 32 extends from an edge of the N terminal 34. As aforementioned, the N terminal 34, the P terminal 24 (the third heat diffusing plate 22), and the O terminal 14 (the first heat diffusing plate 12) are coupled together with the control terminals 81a, 81b by the runners 42a, 42b, and their relative positional relationship is fixed.

The first transistor element 3 is stacked on the first heat diffusing plate 12, and is bonded with a soldered portion (not shown). The first diode element 4 is further staked on the first heat diffusing plate 12, and is bonded with a soldered portion (not shown). The first transistor element 3 is a flat plate type, and an electrode is provided on each of its both surfaces. A collector electrode 3a is provided on a lower surface of the first transistor element 3 (see FIG. 6 to be described later), and an emitter electrode 3b is provided on an upper surface of the first transistor element 3. Further, signal terminals 3d including a gate electrode are provided on the upper surface of the first transistor element 3. A cathode electrode is provided on a lower surface of the first diode element 4, and an anode electrode 4b is provided on an upper surface of the first diode element 4. The first heat diffusing plate 12 connects the collector electrode 3a of the first transistor element 3 and the cathode electrode of the first diode element 4. A spacer 7a is bonded to the emitter electrode 3b on the upper surface of the first transistor element 3 with a soldered portion (not shown). A spacer 7b is bonded to the anode electrode 4b on the upper surface of the first diode element 4 with a soldered portion (not shown). The second heat diffusing plate 15 is bonded on the spacer 7a and the spacer 7b with soldered portions (not shown) (see FIG. 4). The second heat diffusing plate 15 connects the emitter electrode 3b of the first transistor element 3 and the anode electrode 4b of the first diode element 4. One ends of bonding wires 82 are bonded to the signal terminals 3d including the gate electrode on the upper surface of the first transistor element 3 (see FIG. 4). Other ends of the bonding wires 82 are bonded to the control terminals 81b.

The second transistor element 5 is stacked on the third heat diffusing plate 22, and is bonded with a soldered portion (not shown). The second diode element 6 is also stacked on the third heat diffusing plate 22, and is bonded with a soldered portion (not shown). The second transistor element 5 is also a flat plate type, and an electrode is provided on each of its both surfaces. A collector electrode 5a is provided on a lower surface of the second transistor element 5 (see FIG. 6 to be described later), and an emitter electrode 5b is provided on an upper surface of the second transistor element 5. Further, signal terminals 5d including a gate electrode are provided on the upper surface of the second transistor element 5. A cathode electrode is provided on a lower surface of the second diode element 6, and an anode electrode 6b is provided on an upper surface of the second diode element 6. The third heat diffusing plate 22 connects the collector electrode 5a of the second transistor element 5 and the cathode electrode of the second diode element 6. A spacer 7c is bonded to the emitter electrode 5b on the upper surface of the second transistor element 5 with a soldered portion (not shown). A spacer 7d is bonded to the anode electrode 6b on the upper surface of the second diode element 6 with a soldered portion (not shown). The fourth heat diffusing plate 25 is bonded on the spacer 7c and the spacer 7d with soldered portions (not shown) (see FIG. 4). The fourth heat diffusing plate 25 connects the emitter electrode 5b of the second transistor element 5 and the anode electrode 6b of the second diode element 6. One ends of bonding wires 82 are bonded to the signal terminals 5d including the gate electrode on the upper surface of the second transistor element 5. Other ends of the bonding wires 82 are bonded to the control terminals 81a.

A joint 16 extends from an edge of the second heat diffusing plate 15. A second joint 26 extends from an edge of the fourth heat diffusing plate 25. The joint 16 of the second heat diffusing plate 15 opposes to the joint 32 of the N terminal 34, and is bonded thereto with a soldered portion (not shown). The second joint 26 of the fourth heat diffusing plate 25 opposes to the first joint 13 of the first heat diffusing plate 12, and is bonded thereto with a soldered portion (not shown). The first joint 13 and the second joint 26 overlap each other as seen along a stacking direction of the first heat diffusing plate 12, the first transistor element 3, and the second heat diffusing plate 15 (along an X direction in the drawings), and they are connected with the soldered portion. The circuit shown in FIG. 2 is completed by the above connections. The first transistor element 3 corresponds to the transistor 103 in FIG. 2, and the second transistor element 5 corresponds to the transistor 105 in FIG. 2. The first diode element 4 corresponds to the diode 104 in FIG. 2, and the second diode element 6 corresponds to the diode 106 in FIG. 2.

The resin package 9 is formed around the assembly 2a of FIG. 5. The resin package 9 is formed by inserting the assembly 2a in a mold, and injecting molten resin into the mold. That is, the resin package 9 is formed by resin injection molding. The first transistor element 3, the second transistor element 5, the first diode element 4, and the second diode element 6 are embedded in the resin package 9. The first heat diffusing plate 12 and the third heat diffusing plate 22 are exposed at one surface of the resin package 9, and the second heat diffusing plate 15 and the fourth heat diffusing plate 25 are exposed at an opposite surface of the resin package 9.

As aforementioned, the semiconductor elements such as the first transistor element 3, the heat diffusing plates 12, 15, 22, 25, and the spacers 7a to 7d are bonded with the soldered portions. Depiction of the soldered portions had been omitted in FIGS. 3 to 5. Hereinbelow, the semiconductor elements such as the first transistor element 3, the heat diffusing plates 12, 15, 22, 25, and the spacers 7a to 7d, as well as the soldered portions that bond them will be described with reference to FIG. 6.

Figure 6:
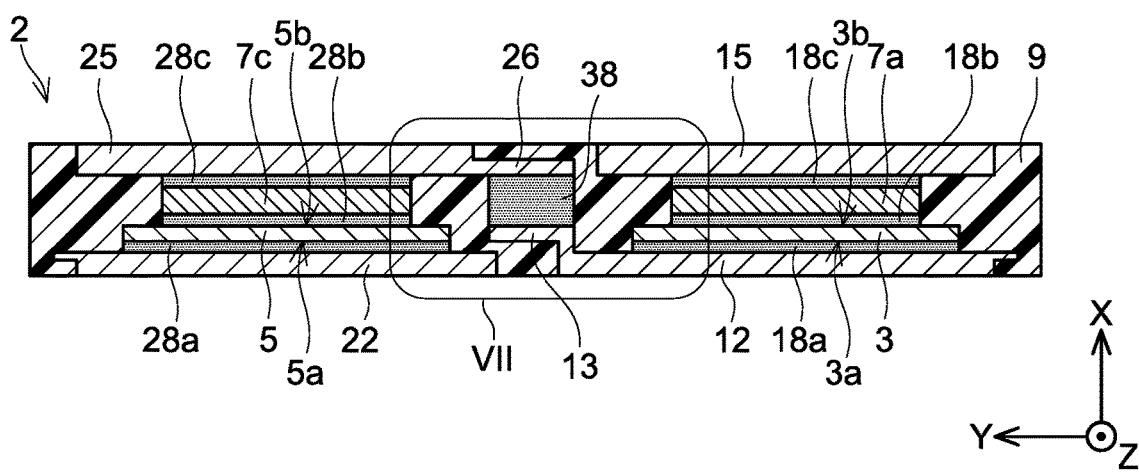
FIG. 6 is a cross sectional view along a VI-VI line in FIG. 1.

FIG. 6 is a cross sectional view along a VI-VI line in FIG. 1. As aforementioned, the collector electrode 3a is provided on the lower surface of the first transistor element 3, and the emitter electrode 3b is provided on the upper surface thereof. The first heat diffusing plate 12 and the collector electrode 3a of the first transistor element 3 are bonded with a soldered portion 18a. The emitter electrode 3b of the first transistor element 3 and the spacer 7a are bonded with a soldered portion 18b. The spacer 7a and the second heat diffusing plate 15 are bonded with a soldered portion 18c. The second heat diffusing plate 15 is bonded to the first transistor element 3 with the soldered portions 18b, 18c and the spacer 7a. The first heat diffusing plate 12 and the second heat diffusing plate 15 interpose the first transistor element 3 in between them, and they are bonded to the electrodes of the first transistor element 3 with the soldered portions 18a, 18b, 18c and the spacer 7a. Hereinbelow, for the sake of simpler explanation, the soldered portions 18a, 18b, 18c existing between the first heat diffusing plate 12 and the second heat diffusing plate 15 that are opposed to each other may collectively be termed first soldered portions 18.

The spacer 7b and the first diode element 4 are also interposed between the first heat diffusing plate 12 and the second heat diffusing plate 15 (see FIGS. 3 to 5). The first diode element 4 and the first heat diffusing plate 12 are bonded with a soldered portion that is of a same material and a same thickness as the soldered portion 18a. The first diode element 4 and the spacer 7b are bonded with a soldered portion that is of a same material and a same thickness as the soldered portion 18b. The spacer 7b and the second heat diffusing plate 15 are bonded with a soldered portion that is of a same material and a same thickness as the soldered portion 18c.

The collector electrode 5a is provided on the lower surface of the second transistor element 5, and the emitter electrode 5b is provided on the upper surface thereof. The third heat diffusing plate 22 and the collector electrode 5a of the second transistor element 5 are bonded with a soldered portion 28a. The emitter electrode 5b of the second transistor element 5 and the spacer 7c are bonded with a soldered portion 28b. The spacer 7c and the fourth heat diffusing plate 25 are bonded with a soldered portion 28c. The fourth heat diffusing plate 25 is connected to the electrode of the second transistor element 5 with the soldered portions 28b, 28c and the spacer 7c. The third heat diffusing plate 22 and the fourth heat diffusing plate 25 interpose the second transistor element 5 in between them, and they are bonded to the electrodes of the second transistor element 5 with the soldered portions 28a, 28b, 28c and the spacer 7c. Hereinbelow, for the sake of simpler explanation, the soldered portions 28a, 28b, 28c existing between the third heat diffusing plate 22 and the fourth heat diffusing plate 25 that are opposed to each other may collectively be termed second soldered portions 28.

The spacer 7d and the second diode element 6 are also interposed between the third heat diffusing plate 22 and the fourth heat diffusing plate 25 (see FIGS. 3 to 5). The second diode element 6 and the third heat diffusing plate 22 are bonded with a soldered portion that is of a same material and a same thickness as the soldered portion 28a. The second diode element 6 and the spacer 7d are bonded with a soldered portion that is of a same material and a same thickness as the soldered portion 28b. The spacer 7d and the fourth heat diffusing plate 25 are bonded with a soldered portion that is of a same material and a same thickness as the soldered portion 28c.

The first joint 13 extends from an edge of the first heat diffusing plate 12, and the second joint 26 extends from an edge of the fourth heat diffusing plate 25. The first joint 13 and the second joint 26 overlap each other as seen along a normal direction of the first heat diffusing plate 12 (along the X direction in the drawings), and are bonded with a soldered portion 38. The soldered portion 38 will be termed a third soldered portion 38 to distinguish it from the first soldered portions 18 and the second soldered portions 28.

Figure 7:
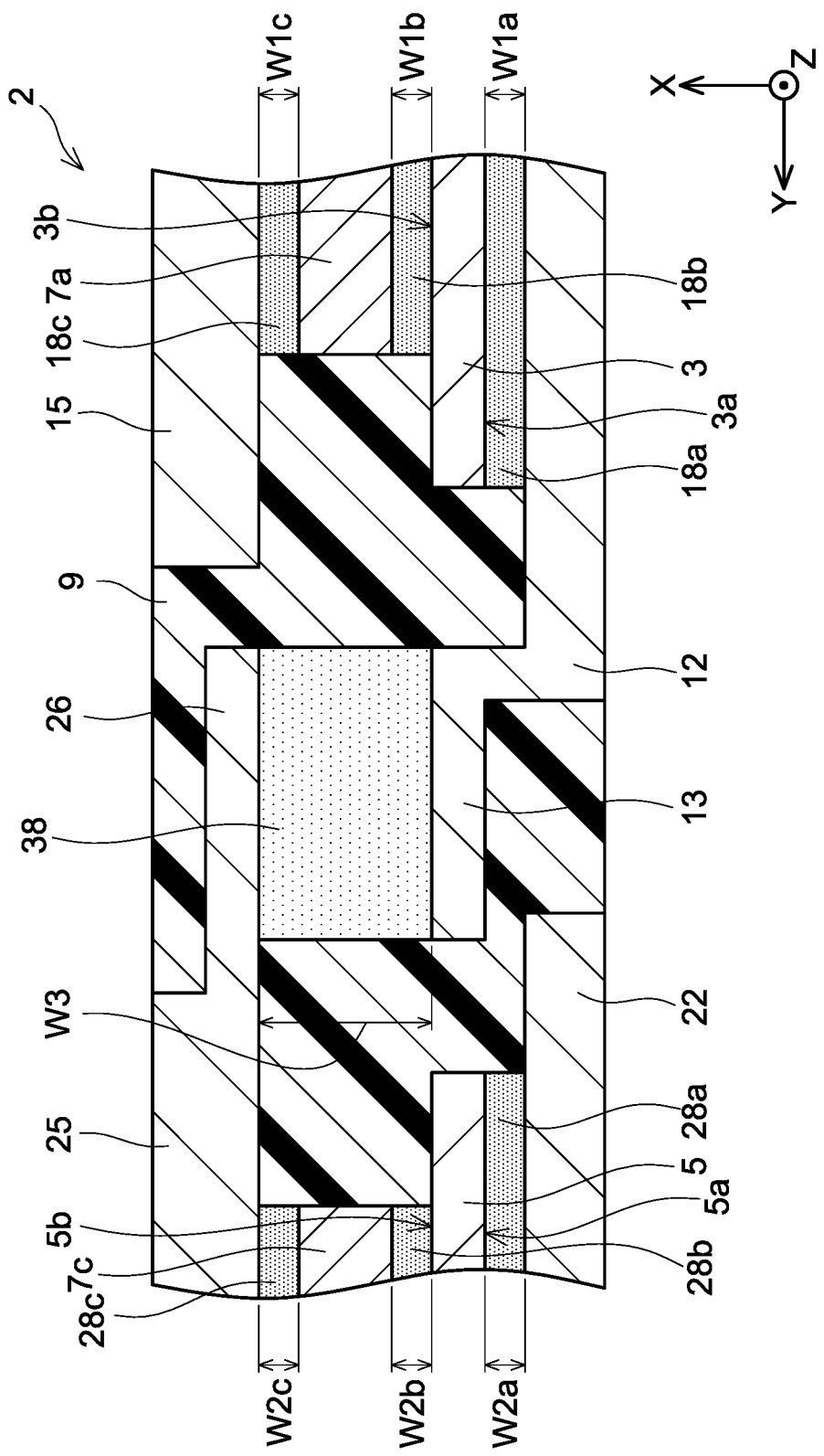
FIG. 7 is an enlarged view of a range indicated by a sign VII in FIG. 6.

An enlarged view of a range indicated by a sign VII in FIG. 6 will be shown in FIG. 7. Signs W1$a$, W1$b$, W1$c$ respectively indicate thicknesses of the soldered portions 18a, 18b, 18c. A total thickness W1, which is a total sum of the thicknesses of the first soldered portions 18 between the first heat diffusing plate 12 and the second heat diffusing plate 15, becomes W1=W1$a$+W1$b$+W1$c$. Signs W2$a$, W2$b$, W2$c$ respectively indicate thicknesses of the soldered portions 28a, 28b, 28c. A total thickness W2, which is a total sum of the thicknesses of the second soldered portions 28 between the third heat diffusing plate 22 and the fourth heat diffusing plate 25, becomes W2=W2$a$+W2$b$+W2$c$. A sign W3 indicates a thickness of the third soldered portion 38. The thickness W3 of the third soldered portion 38 is thicker than the total thickness W1 of the first soldered portions 18, and is also thicker than the total thickness W2 of the second soldered portions 28. Further, a material different from the first soldered portions 18 and the second soldered portions 28 is used for the third soldered portion 38. A solidifying point T1 of the first soldered portions 18 is higher than a solidifying point T3 of the third soldered portion 38. A solidifying point T2 of the second soldered portions 28 is higher than the solidifying point T3 of the third soldered portion 38. In FIG. 7, the first soldered portions 18 and the second soldered portions 28 having the higher solidifying points are shown by dotted hatching with higher dot density than that of the third soldered portion 38 having the lower solidifying point. For example, Sn-0.7Cu solder material may be used for the first soldered portions 18 and the second soldered portions 28. A solidifying point of this material is 227 degrees Celsius. Further, for example, Sn-3.0Ag-0.5Cu solder material may be used for the third soldered portion 38. A solidifying point of this material is 217 degrees Celsius. A relationship of the aforementioned thicknesses and solidifying points provides the following advantages.

Solder contracts upon solidifying. Its contraction amount along a thickness direction becomes larger when a thickness of the solder is larger. In a case of the structure of FIG. 7, the thickness W3 of the third soldered portion 38 is thicker than the total thickness W1 of the first soldered portions 18 and is also thicker than the total thickness W2 of the second soldered portions 28. If the first soldered portions 18, the second soldered portions 28, and the third soldered portion 38 have a same solidifying point, the soldered portions 18, 28, 38 start contracting simultaneously during cooling. When this happens, contraction of the third soldered portion 38 with the greater thickness brings the first joint 13 and the second joint 26 closer, which causes the first heat diffusing plate 12 and the fourth heat diffusing plate 25 to tilt. However, in the semiconductor device 2 of this embodiment, the first soldered portions 18 and the second soldered portions 28, which are with the smaller thicknesses, solidify before the third soldered portion 38 with the larger thickness. That is, the first soldered portions 18 (that is, the soldered portions between the first and second heat diffusing plates 12, 15 opposed to each other) solidify before the first joint 13 is constrained by bonding with the second joint 26. Similarly, the second soldered portions 28 (that is, the soldered portions between the third and fourth heat diffusing plates 22, 25 opposed to each other) solidify before the second joint 26 is constrained by bonding with the first joint 13. Due to this, the first and second heat diffusing plates 12, 15 opposed to each other are bonded while maintaining their parallelism. Similarly, the third and fourth heat diffusing plates 22, 25 opposed to each other are bonded while maintaining their parallelism.

The relationship of the thicknesses and the solidifying points of the soldered portions in the semiconductor device 2 further brings forth the following advantage. If the third soldered portion 38 with the larger thickness between the joints is contracted and solidified first, an interval between the first and second heat diffusing plates 12, 15 opposed to each other and an interval between the third and fourth heat diffusing plates 22, 25 opposed to each other become narrowed. When this happens, the first soldered portions 18 and the second soldered portions 28 originally with the smaller thicknesses have to start their contraction and solidification after having been thinned down due to the bonding between the joints. As a result of this, their post-bonding thicknesses are further reduced. However, in the semiconductor device 2 of this embodiment, the first soldered portions 18 and the second soldered portions 28 with the smaller thicknesses contract and solidify before the third soldered portion 38 with the larger thickness, insufficiency in the post-bonding thicknesses can be avoided.

As aforementioned, the soldered portions between the diode elements, the heat diffusing plates, and the spacers are same as their corresponding soldered portions between the transistor elements, the heat diffusing plates, and the spacers in terms of the materials and the thicknesses, and as such, the above explanation holds true even when the soldered portions bonding the diode elements are considered.

In FIGS. 6 and 7, the thicknesses of the soldered portions are depicted thicker than they actually are for easier understanding. The thicknesses of the soldered portions are defined within a range of approximately 50 to 500 microns.

Next, a method of manufacturing the semiconductor device 2 will be described. Here, the explanation will start from a step of melting/solidifying the soldered portions by putting the assembly 2a of FIG. 5 (that is, a semi-finished product of the semiconductor device 2 before forming the resin package 9) into a furnace. In this assembly 2a, the soldered portions that have not yet been melted are arranged between the heat diffusing plates, the semiconductor element, and the spacers.

Figure 8:
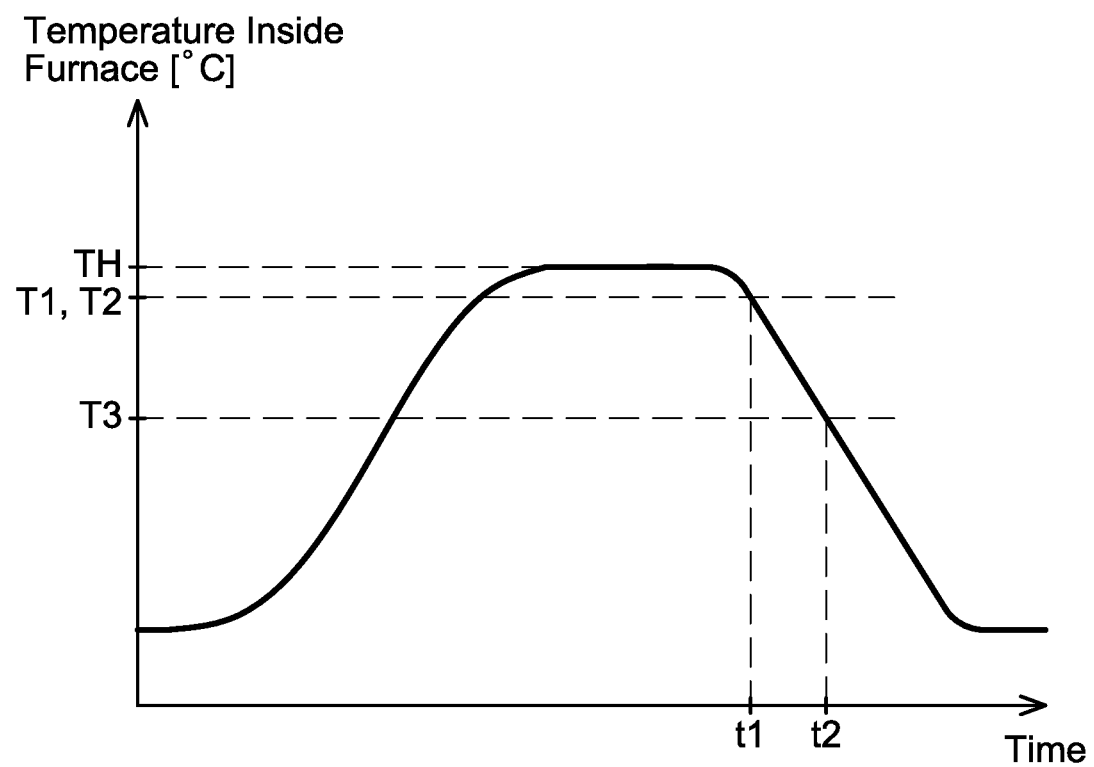
FIG. 8 is a graph showing an example of a temperature profile of a furnace for heating and cooling the assembly of the heat diffusing plates and the semiconductor elements.

FIG. 8 shows a temperature profile of the furnace into which the assembly 2a is to be put. In FIG. 8, a horizontal axis indicates time, and a vertical axis indicates a temperature inside the furnace. Temperature T1 is the solidifying point (melting temperature) of the first soldered portions 18, and temperature T2 is the solidifying point (melting temperature) of the second soldered portions 28. Temperature T3 is the solidifying point (melting temperature) of the third soldered portion 38. Here, the solidifying points and the melting temperatures are supposed as being equivalent for easier explanation.

Firstly, the temperature inside the furnace is raised to a temperature TH, which is higher than the solidifying points (melting temperatures) T1, T2 of the first soldered portions 18 and the second soldered portions 28. All of the soldered portions melt by maintaining the temperature inside the furnace at the temperature TH for a certain period of time. Then, the temperature inside the furnace is decreased. The temperature inside the furnace drops to the solidifying points T1, T2 of the first and second soldered portions 18, 28 at a time t1, and the temperature inside the furnace drops to the solidifying point T3 of the third soldered portion 38 at a time t2. The first soldered portions 18 and the second soldered portions 28 solidify during a period from the time t1 to the time t2. At this timing, the third soldered portion 38 is still melted.

At the time of reaching the time t2, the first soldered portions 18 and the second soldered portions 28 are solidified. The third soldered portion 38 solidifies at the time t2 or later. As above, the third soldered portion 38 solidifies after the first soldered portions 18 and the second soldered portions 28, which have the smaller thicknesses, have been solidified. As aforementioned, the first heat diffusing plate 12 and the second heat diffusing plate 15 are bonded while maintaining their parallelism by solidifying the first soldered portions 18 and the second soldered portions 28 with the smaller thicknesses before the third soldered portion 38 with the larger thickness. The third heat diffusing plate 22 and the fourth heat diffusing plate 25 are similarly bonded while maintaining their parallelism.

After all of the soldered portions have been solidified, the assembly 2a is moved from the furnace into the mold for injection molding, and the resin package 9 is formed. Next, the surface at which the first heat diffusing plate 12 and the third heat diffusing plate 22 are exposed is polished to level surfaces of the first heat diffusing plate 12, the third heat diffusing plate 22, and the resin package 9. Similarly, the surface at which the second heat diffusing plate 15 and the fourth heat diffusing plate 25 are exposed is polished to level surfaces of the second heat diffusing plate 15, the fourth heat diffusing plate 25, and the resin package 9 on the opposite side. At this occasion, since the heat diffusing plates are not tilted, the polishing for achieving level uniformity between the surfaces of the resin package 9 and the heat diffusing plates can be performed at low cost.

As aforementioned, when the semiconductor device 2 is manufactured, the soldered portions between the heat diffusing plates opposed to each other (the first soldered portions 18 and the second soldered portions 28) and the soldered portion between the joints (the third soldered portion 38) do not need to be heated/cooled separately. In manufacturing the semiconductor device 2, the assembly of the first to fourth heat diffusing plates 12, 15, 22, 25 and the semiconductor elements (the transistor elements 3, 5 and the diode elements 4, 6) simply needs to be put into the furnace and heated to a temperature higher than the melting points of all of the soldered portions, and then the temperature of the assembly is brought down to a temperature lower than the solidifying points of all of the soldered portions. In so doing, the soldered portions being thinner ones (the soldered portions with the higher solidifying point) are solidified before the other solder portion (the solder portion with the lower solidifying point).

Figure 9:
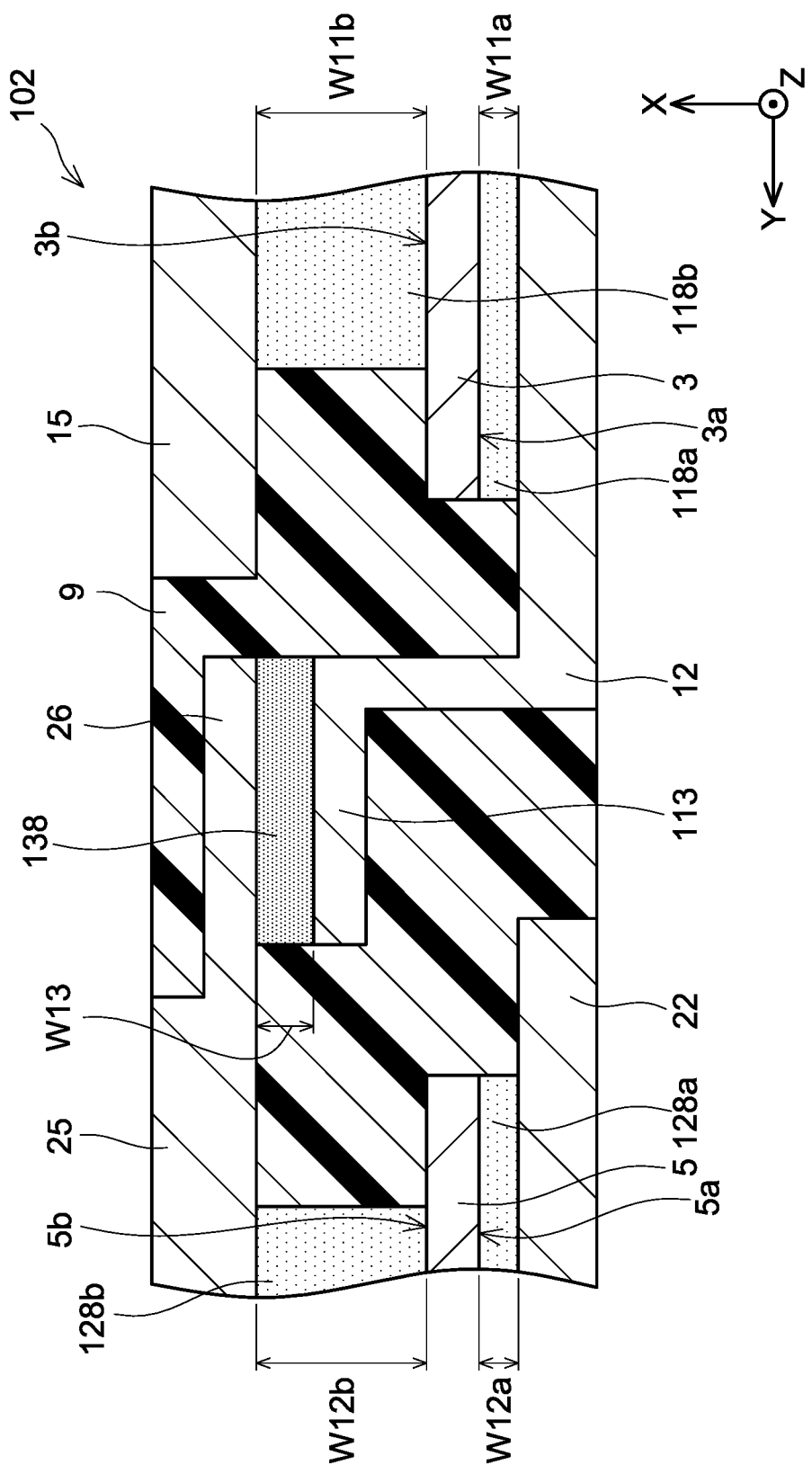
FIG. 9 is a partial cross sectional view of a semiconductor device of a first variant.

(First Variant) Next, a semiconductor device 102 of a first variant will be described with reference to FIG. 9. FIG. 9 is a partial cross sectional view of the semiconductor device 102 of the first variant. Hereinbelow, for the sake of simpler explanation, an electrode of a transistor element and a heat diffusing plate being bonded will be expressed as "a transistor element and a heat diffusing plate are bonded". Further, soldered portions between diode elements and heat diffusing plates are same as their corresponding soldered portions between transistor elements and the heat diffusing plates in terms of their materials and thicknesses. Thus, explanation will be omitted for the soldered portions between the diode elements and the heat diffusing plates on both sides thereof.

In this variant, the second heat diffusing plate 15 and the first transistor element 3 are directly bonded with a soldered portion 118*b* without a spacer. The first transistor element 3 and the first heat diffusing plate 12 are bonded with a soldered portion 118*a*. The soldered portion 118*a* and the soldered portion 118*b* correspond to first soldered portions 118 between the first heat diffusing plate 12 and the second heat diffusing plate 15. The fourth heat diffusing plate 25 and the second transistor element 5 are directly bonded with a soldered portion 128*b* without a spacer. The second transistor element 5 and the third heat diffusing plate 22 are bonded with a soldered portion 128*a*. The soldered portion 128*a* and the soldered portion 128*b* correspond to second soldered portions 128 between the third heat diffusing plate 22 and the fourth heat diffusing plate 25. A first joint 113 extending from an edge of the first heat diffusing plate 12 and the second joint 26 extending from the edge of the fourth heat diffusing plate 25 are bonded with a third soldered portion 138.

In FIG. 9, a sign W11*a* indicates a thickness of the soldered portion 118*a*, and a sign W11*b* indicates a thickness of the soldered portion 118*b*. Further, a sign W12*a* indicates a thickness of the soldered portion 128*a*, and a sign W12*b* indicates a thickness of the soldered portion 128*b*. A total thickness W1 of the first soldered portions 118 is W1=W11*a*+W1*b*. A total thickness W2 of the second soldered portions 128 is W2=W12*a*+W12*b*. A sign W13 indicates a thickness of the third soldered portion 138. In the first variant, the total thickness W1 of the first soldered portions 118 is thicker than the thickness W3 of the third soldered portion 138. Further, the total thickness W2 of the second soldered portions 128 is also thicker than the thickness W3 of the third soldered portion 138. In this variant, a solidifying point T3 of the third soldered portion 138 with the thinner thickness is higher than a solidifying point T1 of the first soldered portions 118 with the thicker thickness, and is also higher than a solidifying point T2 of the second soldered portions 128 with the thicker thickness. In FIG. 9, the third soldered portion 138 with the higher solidifying point is shown by dotted hatching with higher dot density than those of the first soldered portions 118 and the second soldered portions 128 having the lower solidifying points.

In the semiconductor device 102 of the first variant, due to the aforementioned relationship of the solidifying points and thicknesses, when the assembly of the heat diffusing plates 12, 15, 22, 25 and the semiconductor elements is heated and cooled, the third soldered portion 138 having the smallest thickness solidifies first, after which the first soldered portions 118 and the second soldered portions 128 having the larger thicknesses solidify. In this variant, the soldered portion between the joints (the third soldered portion 138) solidifies before the soldered portions between the heat diffusing plates (the first soldered portions 118 and the second soldered portions 128).

The first heat diffusing plate 12 and the fourth heat diffusing plate 25 are tilted, since the third soldered portion 138 between the joints extending from their corresponding edges contract and solidify first. However, since the thickness of the third soldered portion 138 is smaller than those of the first soldered portions 118 and the second soldered portions 128, an influence imposed on the tilt of the first heat diffusing plate 12 and the fourth heat diffusing plate 25 can be suppressed. Although not as prominent as the semiconductor device 2 shown in FIGS. 3 to 7, in the semiconductor device 102 of the first variant, an effect of suppressing the tilt of the heat diffusing plates can be expected.

Figure 10:
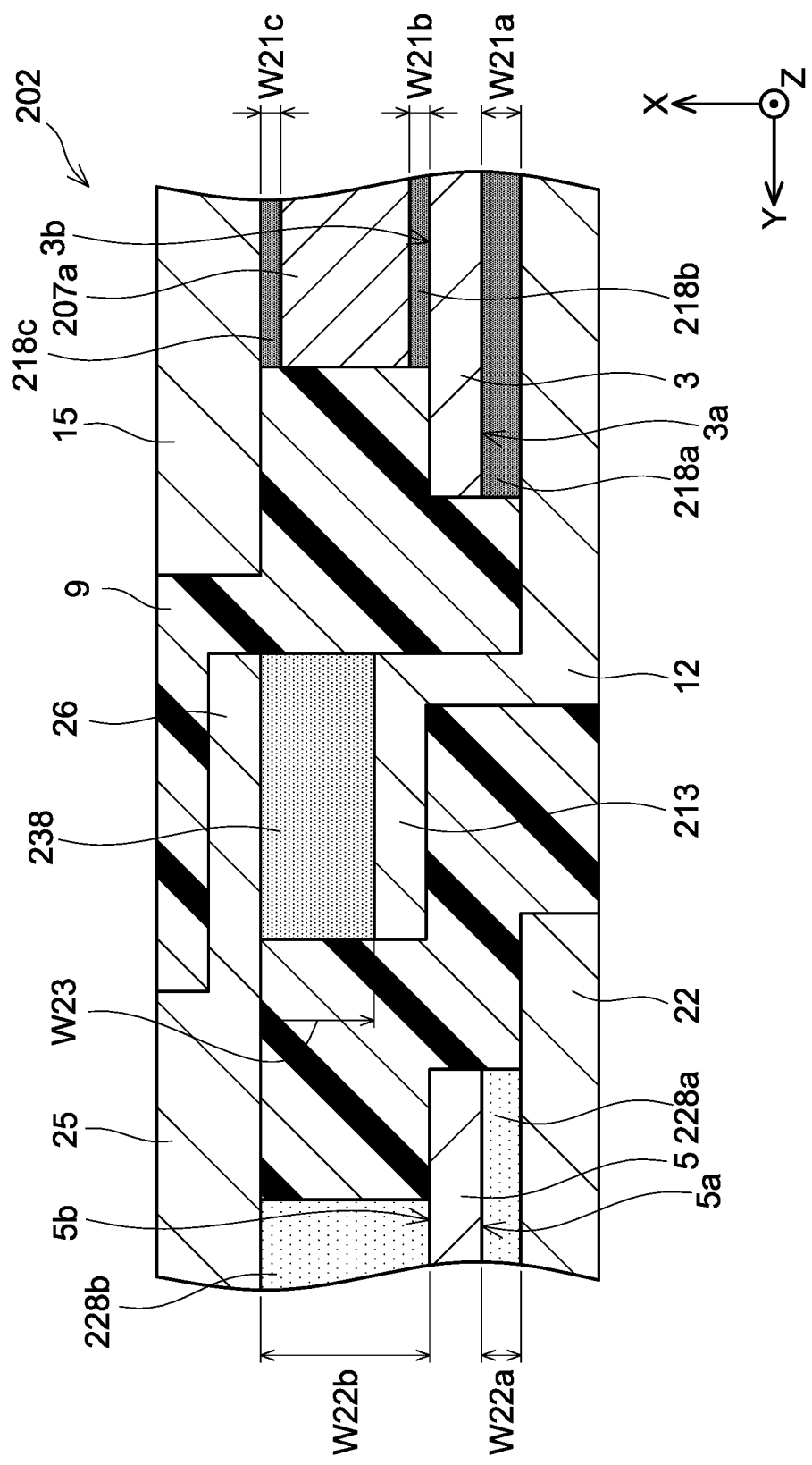
FIG. 10 is a partial cross sectional view of a semiconductor device of a second variant.

(Second Variant) Next, a semiconductor device 202 of a second variant will be described with reference to FIG. 10. FIG. 10 is a partial cross sectional view of the semiconductor device 202 of the second variant. In this variant as well, soldered portions between diode elements and heat diffusing plates are same as their corresponding soldered portions between transistor elements and the heat diffusing plates in terms of their materials and thicknesses. Thus, explanation will be omitted for the soldered portions between the diode elements and the heat diffusing plates on both sides thereof.

In this second variant, the second heat diffusing plate 15 and the first transistor element 3 are bonded by a spacer 207*a* and soldered portions 218*b*, 218*c*. The spacer 207*a* is thicker than the spacer 7*a* shown in FIGS. 3 to 7, and thicknesses of the soldered portions 218*b*, 218*c* are thinner than the thicknesses of the aforementioned soldered portions 18*b*, 18*c*. The first transistor element 3 and the first heat diffusing plate 12 are bonded with a soldered portion 218*a*. The soldered portions 218*a*, 218*b*, 218*c* correspond to first soldered portions 218 between the first heat diffusing plate 12 and the second heat diffusing plate 15. The fourth heat diffusing plate 25 and the second transistor element 5 are directly bonded with a soldered portion 228*b* without a spacer. The second transistor element 5 and the third heat diffusing plate 22 are bonded with a soldered portion 228*a*. The soldered portion 228*a* and the soldered portion 228*b* correspond to second soldered portions 228 between the third heat diffusing plate 22 and the fourth heat diffusing plate 25. A first joint 213 extending from an edge of the first heat diffusing plate 12 and the second joint 26 extending from the edge of the fourth heat diffusing plate 25 are bonded with a third soldered portion 238.

In FIG. 10, a sign W21a indicates a thickness of the soldered portion 218a, a sign W21b indicates a thickness of the soldered portion 218b, and a sign W21c indicates a thickness of the soldered portion 218c. Further, a sign W22a indicates a thickness of the soldered portion 228a, and a sign W22b indicates a thickness of the soldered portion 228b. A total thickness W1 of the first soldered portions 218 is W1=W21a+W21b+W21c. A total thickness W2 of the second soldered portions 228 is W2=W22a+W22b. A sign W23 indicates a thickness of the third soldered portion 238. In the second variant, the thickness W23 of the third soldered portion 238 is smaller than the total thickness W2 of the second soldered portions 228. Further, the total thickness W1 of the first soldered portions 218 is smaller than the thickness W23 of the third soldered portion 238. That is, a relationship of W2>W23>W1 is established. In this variant, a solidifying point T3 of the third soldered portion 238 is lower than a solidifying point T2 of the second soldered portions 228 having the largest thickness, but is higher than a solidifying point T1 of the first soldered portions 218 having the smallest thickness. In FIG. 10, the soldered portions having the higher solidifying points are shown by dotted hatching with higher dot density.

In the second variant, when the assembly of the heat diffusing plates 12, 15, 22, 25 and the semiconductor elements is heated and cooled, the first soldered portions 218 having the smallest thickness solidify first, after which the third soldered portion 238 solidifies, and finally the second soldered portions 228 having the largest thickness solidify. In this variant, the first soldered portions 218 between the first heat diffusing plate 12 and the second heat diffusing plate 15 solidify before the soldered portion between the joints (the third soldered portion 238), and thus the first heat diffusing plate 12 and the second heat diffusing plate 15 are bonded to the first transistor element 3 while maintaining the parallelism thereof.

Further, the second soldered portions 228 between the third heat diffusing plate 22 and the fourth heat diffusing plate 25 solidify after the third soldered portion 238 between the joints had solidified. Since a contraction amount of the third soldered portion 238 which is thinner than the second soldered portions 228 is smaller than a contraction amount of the second soldered portions 228, tilt of the fourth heat diffusing plate 25 can be suppressed. Although not as prominent as the semiconductor device 2 shown in FIGS. 3 to 7, in the semiconductor device 202 of the second variant, an effect of suppressing the tilt of the fourth heat diffusing plate 25 can be expected.

Points to be noted regarding the technique described in the embodiments will be described. The semiconductor devices 2, 102, 202 of the embodiments interpose a transistor element and a diode element between a pair of the heat diffusing plates 12, 15 (22, 25). In recent years, a semiconductor element that integrates the inverse parallel circuit of the transistor and the diode into one chip is being developed. An example of such a semiconductor element is called RC-IGBT. If the semiconductor element that integrates a transistor element and a diode into one chip is employed, a difference between a bonding area of the heat diffusing plates and the electrodes of the semiconductor elements and a bonding area of the joints becomes smaller. When the difference between the bonding area of the heat diffusing plates and the electrodes of the semiconductor elements and the bonding area of the joints becomes smaller, an influence imposed on tilt of the heat diffusing plates by the bond between the joints becomes prominent. The technique disclosed herein is especially effective for a semiconductor device that interposes one compact semiconductor element between a pair of heat diffusing plates. Further, the highest effect can be achieved by configuring the thickness of the soldered portion between the joints (the third soldered portion 38) thicker than those of the soldered portions between the heat diffusing plates (the first soldered portions 18 and the second soldered portions 28) as shown in FIGS. 3 to 7.

The first transistor element 3 and the first diode element 4 of the embodiment correspond to an example of a first semiconductor element. The second transistor element 5 and the second diode element 6 of the embodiment correspond to an example of a second semiconductor element. The first heat diffusing plate 12, the second heat diffusing plate 15, the third heat diffusing plate 22, and the fourth heat diffusing plate 25 respectively correspond to an example of a first metal plate, a second metal plate, a third metal plate, and a fourth metal plate.

Specific examples of the present invention have been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:
1. A semiconductor device comprising:
a first semiconductor element and a second semiconductor element, each of the first semiconductor element and the second semiconductor element comprising electrodes on both surfaces thereof;
a first metal plate and a second metal plate which interpose the first semiconductor element therebetween, the first metal plate and the second metal plate respectively being bonded to the electrodes of the first semiconductor element with respective first soldered portions;
a third metal plate and a fourth metal plate which interpose the second semiconductor element therebetween, the third metal plate and the fourth metal plate respectively being bonded to the electrodes of the second semiconductor element with respective second soldered portions; and
a resin package in which the first semiconductor element and the second semiconductor element are embedded, the first metal plate and the third metal plate being exposed at one surface of the resin package, and the second metal plate and the fourth metal plate being exposed at an opposite surface to the one surface of the resin package,
wherein
a first joint is provided at an edge of the first metal plate,
a second joint is provided at an edge of the fourth metal plate,
the first joint overlaps with the second joint as seen along a direction in which the first metal plate and the first semiconductor element are stacked,
the first joint and the second joint are bonded with a third soldered portion, a total sum of thicknesses of the first soldered portions between the first metal plate and the second metal plate is different from a thickness of the third soldered portion between the first joint and the second joint, a solidifying point of a thinner one of the first soldered portions and the third soldered portion is higher than a solidifying point of a thicker one of the first soldered portions and the third soldered portion, and a total sum of thicknesses of the second soldered portions between the third metal plate and the fourth metal plate is different from the thickness of the third soldered portion between the first joint and the second joint, a solidifying point of a thinner one of the second soldered portions and the third soldered portion is higher than a solidifying point of a thicker one of the second soldered portions and the third soldered portion.

2. The semiconductor device as in claim 1, wherein the total sum of the thicknesses of the first soldered portions is thinner than the thickness of the third soldered portion, and the total sum of the thicknesses of the second soldered portions is thinner than the thickness of the third soldered portion.

\* \* \* \* \*